US012265134B2

(12) United States Patent
Nagano et al.

(10) Patent No.: US 12,265,134 B2
(45) Date of Patent: Apr. 1, 2025

(54) EVALUATION METHOD OF SECONDARY BATTERY

(71) Applicant: TOYOTA JIDOSHA KABUSHIKI KAISHA, Toyota (JP)

(72) Inventors: Aiko Nagano, Nisshin (JP); Mamoru Mizutani, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 18/589,155

(22) Filed: Feb. 27, 2024

(65) Prior Publication Data
US 2024/0201272 A1  Jun. 20, 2024

Related U.S. Application Data

(63) Continuation of application No. 17/378,305, filed on Jul. 16, 2021, now Pat. No. 12,025,674.

(30) Foreign Application Priority Data

Sep. 2, 2020 (JP) ................. 2020-147270

(51) Int. Cl.
*G01R 31/388* (2019.01)
*G01R 31/389* (2019.01)
(Continued)

(52) U.S. Cl.
CPC ......... *G01R 31/388* (2019.01); *G01R 31/389* (2019.01); *H01M 10/486* (2013.01); *H01M 10/0525* (2013.01)

(58) Field of Classification Search
CPC .. G01R 31/386; G01R 31/388; G01R 31/389; G01R 31/392; H01M 10/0525;
(Continued)

(56) References Cited

U.S. PATENT DOCUMENTS

2015/0369867 A1* 12/2015 Kanada ................ H02J 7/0063
324/432
2016/0375790 A1 12/2016 Komiyama
(Continued)

FOREIGN PATENT DOCUMENTS

JP     2012-181037 A     9/2012
JP     2013-149379 A     8/2013
(Continued)

OTHER PUBLICATIONS

Notice of Allowance dated Mar. 20, 2024 in U.S. Appl. No. 17/378,305.

*Primary Examiner* — Catherine T. Rastovski
*Assistant Examiner* — Yossef Korang-Beheshti
(74) *Attorney, Agent, or Firm* — Sughrue Mion, PLLC

(57) ABSTRACT

A durability evaluation method of a secondary battery includes a durability step of continuing to apply an alternating current voltage of a durability frequency to a first secondary battery for evaluation over a durability test period, and an evaluation step of evaluating durability of an associated battery reaction associated with the durability frequency from among battery reactions of the first secondary battery. A temperature and a state of charge of the first secondary battery are adjusted to a first temperature and a first state of charge, respectively.

4 Claims, 10 Drawing Sheets

(51) Int. Cl.
*H01M 10/0525* (2010.01)
*H01M 10/48* (2006.01)

(58) Field of Classification Search
CPC ......... H01M 10/0562; H01M 10/4285; H01M 10/441; H01M 10/448; H01M 10/486; Y02E 60/10
See application file for complete search history.

(56) References Cited

U.S. PATENT DOCUMENTS

| | | |
|---|---|---|
| 2018/0275201 A1 | 9/2018 | Oguma |
| 2022/0065937 A1 | 3/2022 | Nagano |

FOREIGN PATENT DOCUMENTS

| | | | |
|---|---|---|---|
| JP | 2014044149 A | * | 3/2014 |
| JP | 2016-072071 A | | 5/2016 |
| JP | 2016-149288 A | | 8/2016 |
| JP | 2017-9540 A | | 1/2017 |
| JP | 2019-61786 A | | 4/2019 |

* cited by examiner

EVALUATION METHOD OF SECONDARY BATTERY

CROSS-REFERENCE TO RELATED APPLICATIONS

This application is a continuation application of U.S. application Ser. No. 17/378,305, filed on Jul. 16, 2021, which claims priority to Japanese Patent Application No. 2020-147270, filed on Sep. 2, 2020, the disclosures of which are incorporated by reference herein in their entireties.

BACKGROUND

1. Technical Field

The present disclosure relates to an evaluation method of a secondary battery.

2. Description of Related Art

In evaluating durability of a secondary battery, the secondary battery is driven under a predetermined condition over a durability test period determined in advance and evaluation on a deterioration status and the like for various types of deterioration factors of the secondary battery is executed based on a characteristic change and the like of the secondary battery before and after the driving. In such a durability evaluation, in order to accelerate the deterioration of the battery, a high temperature holding test in which the battery is held at a high temperature (see, for example, Japanese Unexamined Patent Application Publication No. 2016-149288), a cycle test in which charging from a first battery voltage to a second battery voltage (from a first state of charge (SOC) to a second SOC, for example, a SOC being from 0% to 100%) and vice versa is repeatedly executed (see, for example, Japanese Unexamined Patent Application Publication No. 2016-072071), or the like are often executed.

SUMMARY

However, even in such a durability test, a long time (for example, one month) is often required to cause deterioration in each part of the battery and to be able to evaluate each deterioration factor. The present disclosure provides an evaluation method of a secondary battery, which can efficiently and appropriately evaluate durability of a specific battery reaction in the secondary battery.

A durability evaluation method of a secondary battery according to an aspect of the present disclosure includes a durability step of continuing to apply an alternating current voltage of a durability frequency to a first secondary battery for evaluation over a durability test period and an evaluation step of evaluating durability of an associated battery reaction associated with the durability frequency from among battery reactions of the first secondary battery. A temperature and a state of charge (SOC) of the first secondary battery are adjusted to a first temperature and a first SOC, respectively.

Generally, there are various stages (types) of battery reactions occurring at a positive electrode and a negative electrode at a time of charging and discharging of the secondary battery. Examples of the various stages of the battery reactions in a lithium-ion secondary battery, a sodium-ion secondary battery, and the like, include movement of an electron in a conductor or an active material, movement of an ion (such as a Li ion and a Na ion) in electrolyte materials (an electrolyte solution and a solid electrolyte), a reaction between the electron and the ion in a negative electrode active material particle, a reaction between the electron and the ion in a positive electrode active material particle, movement of the ion between electrolyte materials on a surface of the (negative electrode or positive electrode) active material particle, or diffusion movement of the ion from the surface to the inside (or from the inside to the surface) of the (negative electrode or positive electrode) active material particle. There are differences in the speed of movement of a charged particle (the electron or the ion) or a reaction therebetween (time required for movement or a reaction) in each stage of the reaction. For example, considering each of the above steps, the speed of the movement of the electron in a conductor or the active material is extremely high, and the speed of the movement of the ion in the electrolyte material is also relatively high. On the other hand, the speed of a reaction between the negative electrode active material and the ion in the negative electrode or the speed of a reaction between the positive electrode active material and the ion in the positive electrode is relatively low. Further, the speed of movement (diffusion) of the ion on the surface of the (negative electrode or positive electrode) active material particle is even lower. In addition, it can be said that the speed of diffusion movement of the ion from the surface to the inside (or from the inside to the surface) of the active material particle is extremely low.

Here, when an alternating current voltage is applied to the secondary battery, a type of battery reaction in which time required for the battery reaction is approximately the same as ½ cycle of the applied alternating current voltage and a type of battery reaction which is faster than that can be caused within the period when the alternating current voltage is positive or negative. However, in a type of battery reaction in which the time required for the battery reaction is slower than ½ cycle of the applied alternating current voltage, the applied alternating current voltage switches between positive and negative voltage in the middle of the battery reaction. Thus, it is considered that the battery reaction cannot be completed. In the type of battery reaction in which the time required for the battery reaction is faster than ½ cycle of the applied alternating current voltage, applying an alternating current voltage of a higher frequency (a shorter cycle) can cause a plurality of number of times of battery reactions within the same period. In other words, considering a certain type of battery reaction from among the battery reactions in the secondary battery, when an alternating current voltage having a cycle (a frequency) in which the time required for the battery reaction is approximately the same as ½ cycle of the alternating current voltage is applied to the secondary battery, it is possible to cause the battery reaction most efficiently and repeatedly in the secondary battery and cause deterioration by the battery reaction most efficiently in the secondary battery.

On the other hand, in the above-described evaluation method of the secondary battery, an alternating current voltage of a durability frequency is applied to a secondary battery for evaluation in the durability step. Therefore, in the secondary battery for the evaluation, it is possible to repeatedly cause a type of battery reaction in which the time required for the battery reaction is the same as or shorter than ½ cycle ($T/2=\frac{1}{2}fe$) determined by the durability frequency fe from among the various battery reactions occurring in the secondary battery. In particular, it is possible to efficiently and repeatedly cause a type of battery reaction in which the time required for the battery reaction is approximately the same as or slightly shorter than ½ cycle (T/2=½fe). Then, in the evaluation step, durability of battery reaction associated with durability frequency of the applied alternating current voltage is evaluated. Therefore, it is possible to efficiently and appropriately evaluate the durability of the specific battery reaction in the secondary battery.

An example of the durability evaluation method of the battery reaction of the secondary battery is a method of comparing the characteristics of the secondary battery before and after the durability test. Further, another example is a method of comparing the characteristics of the secondary battery after the durability test and characteristics of the same type of reference secondary battery (a secondary battery for reference) after leaving over the leaving time which is the same as the length of the durability test time. In addition, it is also possible to compare characteristics after the durability step of a first secondary battery that has undergone the durability step of applying the alternating current voltage of a first durability frequency with that of a second secondary battery that has undergone the durability step of applying the alternating current voltage of a second durability frequency that is higher than the first durability frequency. In this case, a difference in frequency between the first durability frequency and the second durability frequency causes a difference in the type of battery reaction influenced by the application of the alternating current voltage. For this reason, due to the difference in the characteristics of the two, it is easy to obtain knowledge on durability of the type of battery reaction in which the time required for the battery reaction is approximately the same as or slightly shorter than the length of ½ cycle determined by the first durability frequency.

Further, the characteristics of the secondary battery acquired (measured) for use in the evaluation can include an impedance at a specific frequency or an impedance over a certain frequency range. Further, for evaluation, in addition to using the impedance itself, it is possible to create a Cole-Cole plot using the impedance measured over a certain frequency range, separate the plot into resistance components, such as a direct current resistance, a negative electrode reaction resistance, and a positive electrode reaction resistance of the secondary battery, and evaluate the magnitude of the resistance components and changes thereof.

In the above aspect, the evaluation method may further include an initial adjustment step of adjusting the temperature and the SOC of the first secondary battery to a second temperature and a second SOC, which are determined in advance, a pre-durability impedance measurement step of measuring a first impedance of the adjusted first secondary battery over an evaluation frequency range, and a pre-durability adjustment step of adjusting the temperature and the SOC of the first secondary battery to the first temperature and the first SOC. The initial adjustment step, the pre-durability impedance measurement step, and the pre-durability adjustment step are executed before the durability step. The evaluation method may further include a post-durability adjustment step of adjusting the temperature and the SOC of the first secondary battery after the durability step to the second temperature and the second SOC and a post-durability impedance measurement step of measuring a second impedance of the adjusted first secondary battery over the evaluation frequency range. The post-durability adjustment step and the post-durability impedance measurement step are executed after the durability step and before the evaluation step. In the evaluation step, the durability of the battery reaction of the first secondary battery may be evaluated using the first impedance and the second impedance obtained for the first secondary battery.

In the evaluation method, in order to align the state of the evaluation secondary battery, the temperature and the SOC of the evaluation secondary battery (the first secondary battery) are respectively adjusted to the same "evaluation battery temperature" (the second temperature) and "evaluation SOC" (the second SOC) in the initial adjustment step and the post-durability adjustment step, and thereafter a pre-durability impedance and a post-durability impedance of the secondary battery are measured, respectively. As such, since the above impedances of the evaluation secondary battery, adjusted to the evaluation battery temperature and the evaluation SOC different from the durability battery temperature (the first temperature) and the durability SOC (the first SOC) in the durability step, are acquired, respectively, it is possible to evaluate the pre-durability and the post-durability characteristics of the evaluation secondary battery at the evaluation battery temperature and the evaluation SOC appropriate for the evaluation in the evaluation of the evaluation secondary battery while executing the durability test at the durability battery temperature and the durability SOC appropriate for the durability test in the durability step.

As the "evaluation battery temperature" and the "evaluation SOC", a temperature and a SOC value at which a characteristic difference of the secondary battery due to deterioration of each part by the durability step easily appears are selected. As the "evaluation battery temperature", for example, in addition to room temperature (about 25° C.), a temperature within a low temperature range, such as −30° C. (for example, a range of −10° C. to −50° C.) can be employed. Further, as the "evaluation SOC", a value within, for example, a low SOC region, such as SOC=20% (for example, a range of 0% to 30%) or a value within a high SOC region, such as SOC=90% and 100% (for example, a rage of SOC=80% to 110%) is used.

In the above aspect, the evaluation step may include a pre-durability resistance acquisition step of acquiring a first direct current resistance, a first positive electrode reaction resistance, and a first negative electrode reaction resistance of the first secondary battery using the first impedance measured over the evaluation frequency range and a post-durability resistance acquisition step of acquiring a second direct current resistance, a second positive electrode reaction resistance, and a second negative electrode reaction resistance of the first secondary battery using the second impedance measured over the evaluation frequency range.

In the evaluation method, since the pre-durability direct current resistance, the pre-durability positive electrode reaction resistance, and the pre-durability negative electrode reaction resistance are acquired in the pre-durability resistance acquisition step of the evaluation step and the post-durability direct current resistance, the post-positive electrode reaction resistance, and the post-durability negative electrode reaction resistance are acquired in the post-durability resistance acquisition step, using them, it is possible to evaluate the characteristics, such as a characteristic change before and after the durability test of the evaluation secondary battery.

Examples of a method of obtaining direct current resistance, positive electrode reaction resistance, negative electrode reaction resistance, and the like using the acquired pre-durability impedance or post-durability impedance include a method of creating the Cole-Cole plot using the impedance acquired over a predetermined frequency range and obtaining the direct current resistance and the like from a form of the trajectory thereof. In order to obtain the direct current resistance and the like from the Cole-Cole plot, a magnitude of the direct current resistance and the like that matches an assumed equivalent circuit is calculated using software.

In the above aspect, the evaluation method may further include a reference initial adjustment step of adjusting a temperature and a SOC of a second reference secondary battery to a second temperature and a second SOC, a pre-leaving impedance measurement step of measuring a third impedance of the adjusted second secondary battery over an evaluation frequency range, a pre-leaving adjustment step of adjusting the temperature and the SOC of the second secondary battery to the first temperature and the first SOC, a leaving step of continuing to leave, over the durability test period, the second secondary battery of which the temperature and the SOC are adjusted to the first temperature and the first SOC in a state where positive and negative electrodes are open, a post-leaving adjustment step of adjusting the temperature and the SOC of the second secondary battery after the leaving step to the second temperature and the second SOC, and a post-leaving impedance measurement step of measuring a fourth impedance of the adjusted second secondary battery over the evaluation frequency range. The second secondary battery is different from the first secondary battery. In the evaluation step, the durability of the battery reaction of the first secondary battery may be evaluated using at least the fourth impedance from among the third impedance and the fourth impedance of the second secondary battery.

In the evaluation method, in addition to the evaluation secondary battery, using the reference secondary battery (the second secondary battery), a pre-leaving impedance and a post-leaving impedance are obtained before and after the leaving step of continuing to leave the reference secondary battery over the durability test period. Then, in the evaluation step, the durability of a battery reaction of the evaluation secondary battery is evaluated using at least the post-leaving impedance from among the pre-leaving impedance and the post-leaving impedance.

For this reason, it is possible to more appropriately evaluate the durability of the battery reaction of the evaluation secondary battery associated with the durability frequency by comparing a case where the alternating current voltage of the durability frequency is applied (the evaluation secondary battery) and a case where it is not applied (the reference secondary battery) over the same durability test period.

In the evaluation of the evaluation secondary battery, it is possible to execute the evaluation using the post-leaving impedance of the reference secondary battery as well. Further, it is possible to evaluate each characteristic of the evaluation secondary battery by obtaining, from the post-leaving impedance, the post-leaving direct current resistance, the post-leaving positive electrode reaction resistance, and the post-leaving negative electrode reaction resistance, and comparing them with the pre-durability direct current resistance, the pre-durability positive electrode reaction resistance, and the pre-durability negative electrode reaction resistance of the evaluation secondary battery or comparing them with the post-durability direct current resistance, the post-durability positive electrode reaction resistance, and the post-durability negative electrode reaction resistance that are acquired in the post-durability resistance acquisition step.

As the reference secondary battery, a battery having the same configuration and the same characteristics (a battery of the same product number and the same lot) as those of the evaluation secondary battery may be used. Further, it is possible to execute the evaluation using the pre-leaving impedance of the reference secondary battery as well. Further, it is also possible to evaluate each characteristic of the evaluation secondary battery by obtaining, from the pre-leaving impedance, the pre-leaving direct current resistance, the pre-leaving positive electrode reaction resistance, and the pre-leaving negative electrode reaction resistance, and using them.

In the above aspect, the evaluation step may include at least a post-leaving resistance acquisition step from among a pre-leaving resistance acquisition step of acquiring a third direct current resistance, a third positive electrode reaction resistance, and a third negative electrode reaction resistance of the second secondary battery using the third impedance measured over the evaluation frequency range and the post-leaving resistance acquisition step of acquiring a fourth direct current resistance, a fourth positive electrode reaction resistance, and a fourth negative electrode reaction resistance of the second secondary battery using the fourth impedance measured over the evaluation frequency range.

In the evaluation method, since the pre-leaving direct current resistance, the pre-leaving positive electrode reaction resistance, and the pre-leaving negative electrode reaction resistance are acquired in the pre-leaving resistance acquisition step of the evaluation step and the post-leaving direct current resistance, the post-leaving positive electrode reaction resistance, and the post-leaving negative electrode reaction resistance are acquired in the post-leaving resistance acquisition step, it is possible to evaluate the characteristics, such as the characteristic change before and after the durability test of the evaluation secondary battery based on the reference secondary battery as a reference, using them as well.

Examples of a method of obtaining the direct current resistance and the like using the pre-leaving impedance and the post-leaving impedance include a method of creating the Cole-Cole plot using the impedance obtained over the predetermined frequency range and obtaining, from it, the direct current resistance and the like, in the same manner as in the case of the above-described pre-durability impedance and post-durability impedance.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

First Embodiment

Figure 1:
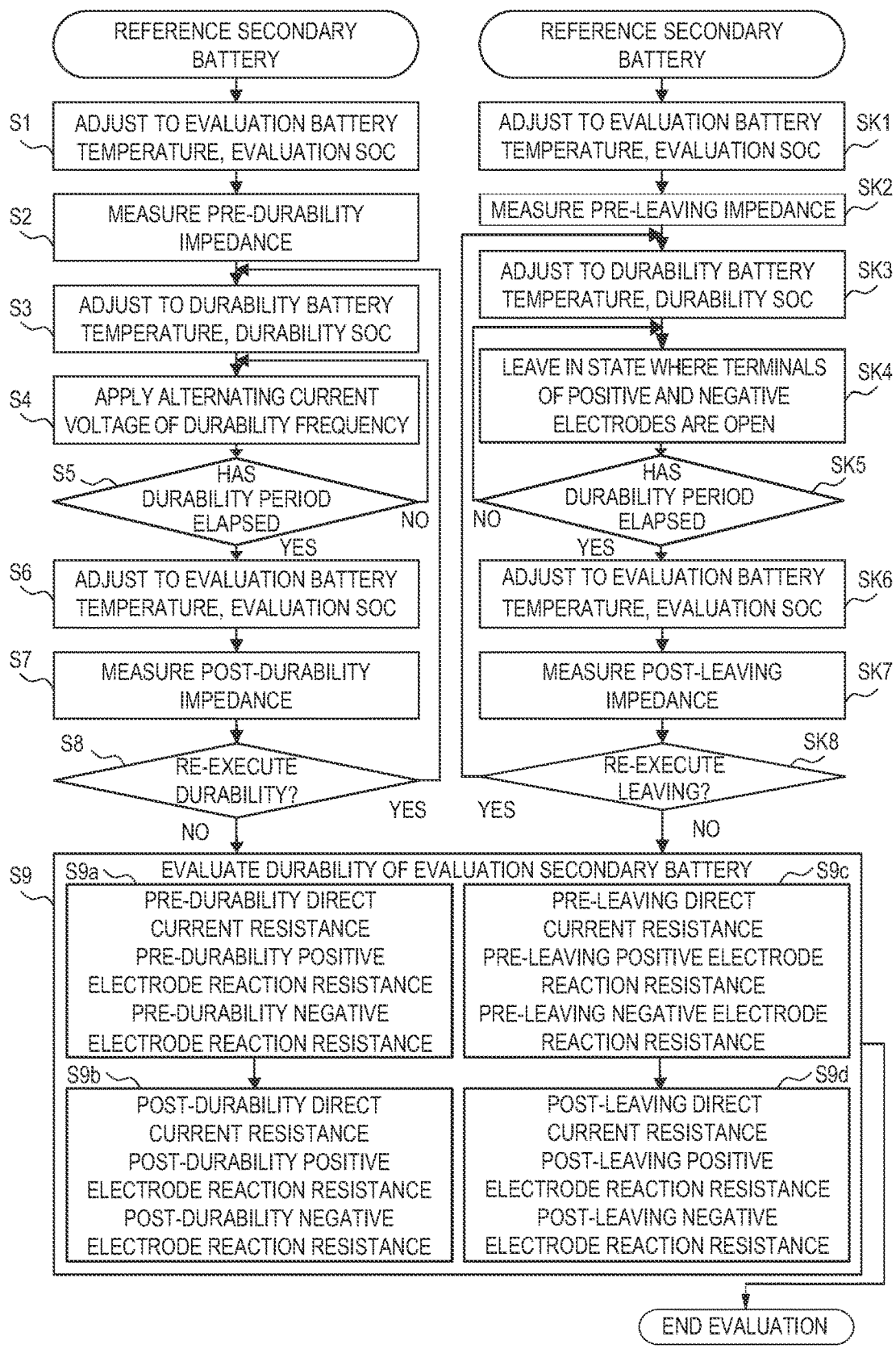
FIG. 1 is a flowchart illustrating a procedure of an evaluation method of a battery according to an embodiment.

Hereinafter, an embodiment of the present disclosure will be described with reference to drawings. First, in the present embodiment, an all-solid-state lithium-ion secondary battery (not shown, hereinafter simply referred to as a secondary battery or a battery) used for each measurement is manufactured as described below.

Synthesis of Solid Electrolyte

A solid electrolyte powder was obtained by weighing a $Li_2S$ powder (0.550 g), a $P_2S_5$ powder (0.877 g), a LiI powder (0.285 g), and a LiBr powder (0.277 g) and mixing them in an agate mortar for 5 minutes, and then adding a dehydrated heptane (4 g) thereto and mechanically milling it for 40 hours using a planetary ball mill.

Manufacturing of Negative Electrode Mixture Paste

A negative electrode mixture paste was obtained by weighing a powder of a lithium titanate $Li_4Ti_5O_{12}$ (hereinafter also referred to as an LTO) having a size of the average primary particle of 0.7 μm (1.0 g) as a negative electrode active material, a vapor grown carbon fiber that is a conductive material carbon (0.024 g), a PVDF (0.048 g), and a butyl butyrate (1.6 g), mixing them for 30 minutes or longer using an ultrasonic homogenizer (UH-50 manufactured by SMT), adding the above-described solid electrolyte powder (0.336 g) thereto, and mixing it again using the above-described ultrasonic homogenizer.

Manufacturing of Positive Electrode Mixture Paste $LiNi_{1/3}Co_{1/3}Mn_{1/3}O_2$ was used as a positive electrode active material. A surface treatment was executed to the active material using $LiNbO_3$. A positive electrode mixture paste was obtained by weighing the positive electrode active material (2.0 g), a vapor grown carbon fiber that is a conductive material carbon (0.048 g), a solid electrolyte (0.407 g), a PVDF (0.016 g), and a butyl butyrate (1.3 g), and mixing them using the above-described ultrasonic homogenizer.

Manufacturing of Solid Electrolyte Layer Paste

A solid electrolyte layer paste was obtained by putting a heptane solution containing 5 wt % of a butadiene rubber binder and a $LiI$—$Li_2S$—$P_2S_5$ glass-ceramic powder having an average particle size of 2.5 μm as a solid electrolyte into a polypropylene container and stirring them in an ultrasonic disperser for 30 seconds, and then shaking the container in a shaker for 3 minutes.

Manufacturing of Positive Electrode and Negative Electrode

The above-described positive electrode mixture paste was coated on an aluminum foil by a blade method using an applicator. By drying it on a hot press at 100° C. for 30 minutes after coating, a positive electrode plate having a positive electrode mixture layer on one surface of the aluminum foil was obtained. Similarly, the above-described negative electrode mixture paste was coated on a copper foil by the blade method using the applicator. By drying it on a hot press at 100° C. for 30 minutes after coating, a negative electrode plate having a negative electrode mixture layer on one surface of the copper foil was obtained. A target weight of the positive electrode mixture was 18 mg/cm² and a target weight of the negative electrode mixture was adjusted such that a capacity ratio of the negative electrode plate to the positive electrode plate was 1.3. At this time, the capacity ratio was calculated assuming that a theoretical capacity of carbon particles as the negative electrode active material was 370 mAh/g and a theoretical capacity of LTO was 165 mAh/g.

Coating of Solid Electrolyte Layer Paste on Positive Electrode Side

The above-described manufactured positive electrode plate was pre-pressed, the solid electrolyte layer paste was coated on the surface of the positive electrode mixture layer of the positive electrode plate after the pre-press by a die coater, and dried on a hot plate at 100° C. for 30 minutes. Thereafter, by executing a roll press at a surface pressure of 2 ton/cm², a positive electrode side laminate having a solid electrolyte layer on the surface of the positive electrode mixture layer was obtained.

Coating of Solid Electrolyte Layer Paste on Negative Electrode Side

The above-described manufactured negative electrode plate was also pre-pressed, the solid electrolyte layer paste was coated on the surface of the negative electrode mixture layer of the negative electrode plate after the pre-press by a die coater, and dried on a hot plate at 100° C. for 30 minutes. Thereafter, by executing a roll press at a surface pressure of 2 ton/cm², a negative electrode side laminate having a solid electrolyte layer on the surface of the negative electrode mixture layer was obtained.

Manufacturing of all-Solid-State Lithium-Ion Secondary Battery

Each of the positive electrode side laminate and the negative electrode side laminate manufactured as described above was punched in a circular shape having a facing area of 1 cm² and the solid electrolyte layers thereof were superposed so as to be bonded to each other. However, an unpressed solid electrolyte layer (the solid electrolyte layer paste) was transferred onto the solid electrolyte layer of the positive electrode side laminate, and the solid electrolyte layer of the positive electrode side laminate and the solid electrolyte layer of the negative electrode side laminate were superposed such that the unpressed solid electrolyte layer was interposed therebetween. Thereafter, by pressing the solid electrolyte layer at a pressure of 2 ton/cm² and a temperature of 130° C., a power generation element having a positive electrode mixture layer, a solid electrolyte layer, and a negative electrode mixture layer in this order was obtained between a positive electrode foil (the aluminum foil) and a negative electrode foil (the copper foil). By laminating and sealing the obtained power generation element and restraining it at a restraining pressure of 5 MPa using a restraining jig, an all-solid-state lithium-ion secondary battery was obtained.

Conditioning

Thereafter, under an environment of 25° C. as a condition, CCCV charging/discharging was executed for 3 cycles in a battery voltage range of 4.35 to 3.00 V with a current of a charge/discharge rate of 0.1 C.

Evaluation of all-Solid-State Lithium-Ion Secondary Battery

Using five secondary batteries (first secondary batteries) as evaluation batteries Ba to Be and one secondary battery (a second secondary battery) as a reference battery Bf from among the secondary batteries having the same lot that have been conditioned as described above, a durability test and a leaving test are executed according to the following procedure (see FIG. 1).

First, the leaving test using the reference battery Bf will be described. First, in a reference initial adjustment step SK1, the SOC of the reference battery Bf is adjusted to an evaluation SOC (a second SOC) SOCe (SOCe=20%) by the CCCV discharging, and then the reference battery Bf is left under an environment of an evaluation battery temperature (a second temperature) Te (Te=−30° C.) for 3 hours or longer.

Thereafter, in a pre-leaving impedance measurement step SK2, the pre-leaving impedance ZBf(0) of the reference battery Bf over a predetermined evaluation frequency range Wfe (in the present embodiment, a range of frequency f=1 MHz to 0.01 Hz) is measured using Solartron 1260 manufactured by Solartron Analytical. In step SK2 and the pre-durability impedance measurement step S2 to be described below, the impedances of the reference battery Bf and the evaluation batteries Ba to Be are measured in a state of a low temperature and a low SOC because the impedance of the battery tends to become large and a change in the characteristics due to the leaving test or the durability test tends to be easily detected in such a state.

Next, the process proceeds to a pre-leaving adjustment step SK3, the SOC of the reference battery Bf is adjusted to a durability SOC (a first SOC) SOCd (SOCd=80%) by the CCCV charging, and then the reference battery Bf is left under an environment of a durability battery temperature (a first temperature) Td (Td=60° C.) for 3 hours or longer.

Thereafter, in leaving steps SK4 and SK5, the reference battery Bf is left over a durability period Dd1 (5 days in the present embodiment) in a state where the terminals of the positive and negative electrodes are open. In other words, in step SK4, the reference battery Bf is left in the state where the terminals of the positive and negative electrodes are open, and in step SK5, it is determined whether the durability period Dd1 has elapsed. When the determination is NO in step SK5, that is, when the durability period Dd1 has not elapsed, the process returns to step SK4 and the leaving test is continued. On the other hand, when the determination is YES in step SK5, that is, when the durability period Dd1 has elapsed, the leaving test is ended and the process proceeds to step SK6. The leaving test for the reference battery Bf (step SK4) and the durability test for the evaluation batteries Ba to Be (step S4) to be described below are executed in a state of a high temperature and a high SOC because the deterioration of the battery easily progresses and a change in characteristics due to the leaving test or the durability test tends to be easily generated in such a state.

Similar to step SK2, in a post-leaving adjustment step SK6, the reference battery Bf is left under an environment of the evaluation battery temperature Te (Te=−30° C.) for 3 hours or longer, and then the SOC of the reference battery Bf is adjusted to the evaluation SOC SOCe (SOCe=20%) by the CCCV discharging. Thereafter, similar to step SK3, in a post-leaving impedance measurement step SK7, an impedance after leaving the reference battery Bf for 5 days (hereinafter referred to as a 5-day post-leaving impedance) ZBf(5) over the evaluation frequency range Wfe is measured.

In the following re-leaving determination step SK8, it is determined whether to execute the re-leaving test. When the determination is YES in step SK8, that is, when the leaving test is re-executed, the process returns to step SK3, the SOC of the reference battery Bf is adjusted to the durability SOC SOCd (SOCd=80%) by the CCCV charging, and then the reference battery Bf is left under an environment of the evaluation battery temperature Te (Te=60° C.) for 3 hours or longer. Thereafter, steps SK4 to SK7 are re-executed and the process returns to step SK8. In the present embodiment, the leaving test is re-executed only once in step SK8, such that in a second step SK7, an impedance after leaving the reference battery Bf for 10 days (hereinafter referred to as a 10-day post-leaving impedance) ZBf(10) over the evaluation frequency range Wfe is measured.

On the other hand, when the determination is NO in step SK8, that is, when the leaving test is not re-executed, the process proceeds to evaluation step S9. As such, in the present embodiment, in the reference battery Bf, in addition to the pre-leaving impedance ZBf(0), the 5-day post-leaving impedance ZBf(5) and the 10-day post-leaving impedance ZBf(10) are obtained.

Next, five types of evaluation tests using the five evaluation batteries Ba to Be will be described. First, similar to the reference battery Bf in step SK1, in the initial adjustment step S1, the SOCs of the evaluation batteries Ba to Be are adjusted to the evaluation SOC SOCe (SOCe=20%) by the CCCV discharging, and then the evaluation batteries Ba to Be are left under an environment of the evaluation battery temperature Te (Te)=−30° C.) for 3 hours or longer. Thereafter, similar to step SK2, in the pre-durability impedance measurement step S2, the pre-durability impedances (first impedances) ZBa(0) to ZBe(0) of the evaluation batteries Ba to Be over the evaluation frequency range Wfe (in the present embodiment, the range of the frequency f=1 MHz to 0.01 Hz) are measured.

Next, similar to the reference battery Bf in step SK3, the process proceeds to a pre-durability adjustment step S3, and the SOCs of the evaluation batteries Ba to Be are adjusted to the durability SOC SOCd (SOCd=80%) by the CCCV charging, and then the evaluation batteries Ba to Be are left under an environment of the durability battery temperature Td (Td=60° C.) for 3 hours or longer.

Thereafter, in the durability steps S4 and S5, the alternating current voltages (35 mVrm) of the durability frequencies $f_{da}$ to $f_{de}$ are continuously applied, respectively, to between the terminals of the positive and negative electrodes of the evaluation batteries Ba to Be over the durability period Dd1 (in the present embodiment, 5 days). In other words, in step S4, the alternating current voltages are applied, respectively, to between the terminals of the positive and negative electrodes of the evaluation batteries Ba to Be, respectively, and in step S5, it is determined whether the durability period Dd1 has elapsed. When the determination is NO in step S5, that is, when the durability period Dd1 has not elapsed, the process returns to step S4 and the evaluation test is continued. On the other hand, when the determination is YES in step S5, that is, when the durability period has elapsed, the evaluation test is ended and the process proceeds to a post-durability adjustment step S6.

In the present embodiment, in the durability test in step S4, as the durability frequencies $f_{da}$ to $f_{de}$ of the alternating current voltages applied to between the terminals of the positive and negative electrodes of the evaluation batteries Ba to Be, $f_{da}$=50 kHz, $f_{db}$=30 kHz, $f_{de}$=1 kHz, $f_{dd}$=0.1 Hz, $f_{de}$=0.1 mHz are selected. The selection of the frequencies will be described with reference to FIGS. 2 and 3.

Figure 3:
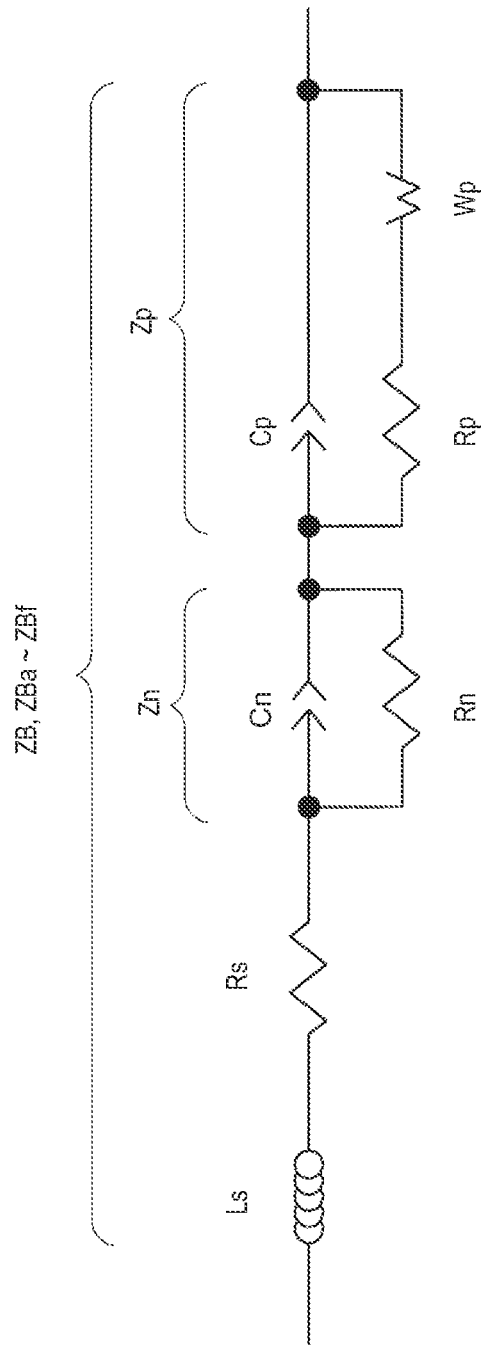
FIG. 3 is an equivalent circuit diagram of the evaluation battery obtained using the Cole-Cole plot of FIG. 2.

FIG. 3 illustrates an equivalent circuit of the battery impedances ZBa to ZBf indicated by the evaluation batteries Ba to Be and the reference battery Bf used for the evaluation in the present embodiment. The equivalent circuit of the battery impedances ZBa to ZBf illustrated in FIG. 3 is represented by a series circuit of a direct current impedance portion Zdc, a negative electrode impedance portion Zn, and a positive electrode impedance portion Zp. Of these, the direct current impedance portion Zdc is provided by a series circuit of a direct current inductance Ls and a direct current resistance Rs. Further, the negative electrode impedance portion Zn is provided by a parallel circuit of a negative electrode capacitance Cn and a negative electrode reaction resistance Rn. In addition, the positive electrode impedance portion Zp is provided by a parallel circuit of a series circuit of a positive electrode reaction resistance Rp and a Warburg impedance Wp, and a positive electrode capacitance Cp.

Of these, the direct current inductance Ls and the direct current resistance Rs are inductance and resistance generated in a wiring and the like inside a battery. On the other hand, of the negative electrode impedance portion Zn, the negative electrode capacitance Cn indicates a capacitor component generated in the negative electrode, and the negative electrode reaction resistance Rn indicates a resistance component generated according to an electrode reaction in the negative electrode. On the other hand, of the positive electrode impedance portion Zp, the positive electrode capacitance Cp indicates a capacitor component generated in the positive electrode, and the positive electrode reaction resistance Rp indicates a resistance component generated according to an electrode reaction in the positive electrode. Further, the Warburg impedance Wp indicates an impedance generated due to diffusion movement of a Li ion in a positive electrode active material particle and a negative electrode active material particle.

When a frequency change of the battery impedance ZB shown in the equivalent circuit is indicated by the Cole-Cole plot (a Nyquist plot), it typically generates a part that changes to a semicircular arc shape corresponding to the magnitudes of the negative electrode capacitance Cn and the negative electrode reaction resistance Rn of the negative electrode impedance portion Zn. Further, it generates a part that changes to a semicircular arc shape corresponding to the magnitudes of the positive electrode capacitance Cp and the positive electrode reaction resistance Rp of the positive electrode impedance portion Zp. However, the positive electrode impedance portion Zp changes to a pattern in which the lower the frequency side is, the larger a resistance Z' and a capacitive reactance Z" become due to the presence of the Warburg impedance Wp on the lower frequency side than that of a part that changes to the semicircular arc shape. For this reason, the part on the low frequency side (the side where the resistance Z' is large) of the part that changes to the semicircular arc shape changes by gradually shifting to a pattern in which the lower the frequency side is, the larger the resistance Z' and the capacitive reactance Z" become due to the Warburg impedance Wp. Further, in the Cole-Cole plot of the battery impedance ZB, as described above, two parts that change to the semicircular arc shape on the equivalent circuit are generated. However, in an actual battery, in the graph of the Cole-Cole plot of the battery impedance ZB, the two parts that change to the semicircular arc shape are not necessarily clearly recognized. In each battery of the present embodiment, it is found that a frequency range that generates a change to the semicircular arc shape due to the negative electrode impedance portion Zn is slightly higher than a frequency range that generates a change to the semicircular arc shape due to the positive electrode impedance portion Zp.

Figure 2:
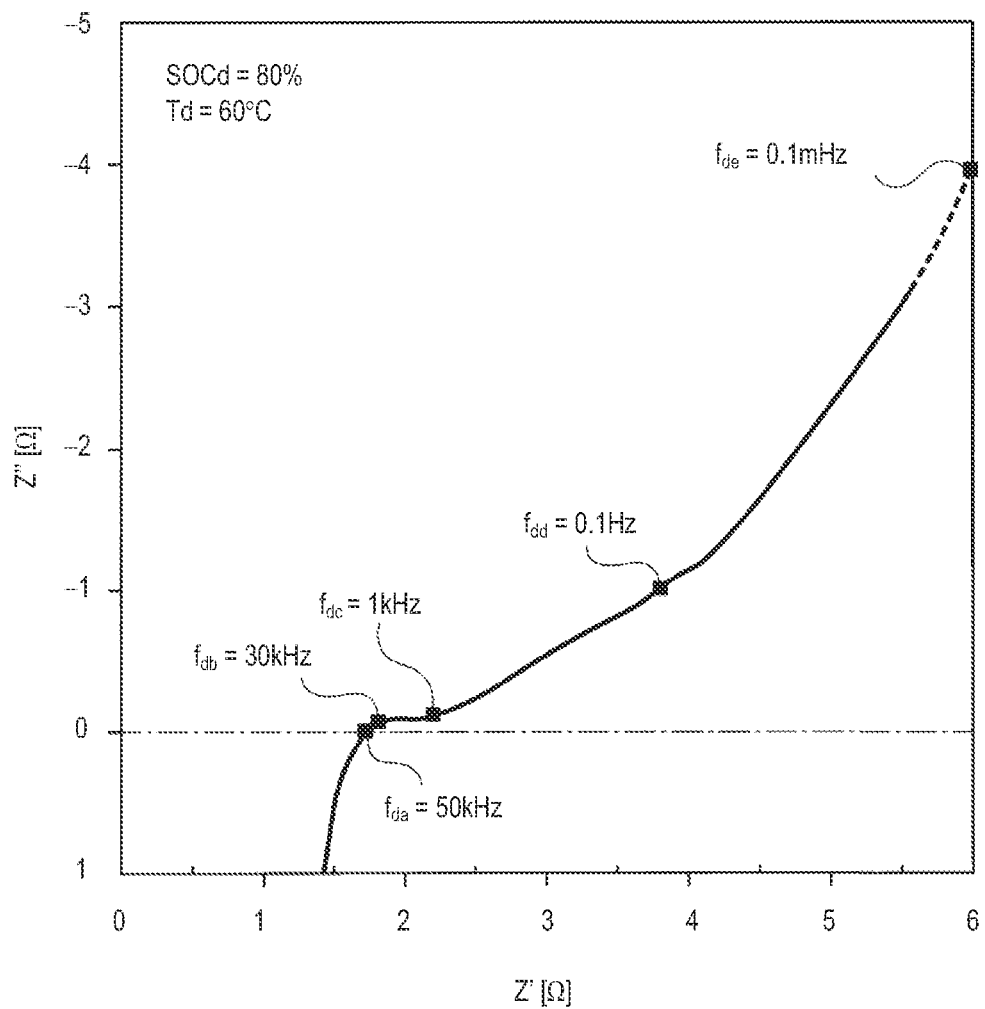
FIG. 2 is a graph illustrating a relationship between a Cole-Cole plot of an impedance of an evaluation battery of which a temperature and a state of charge (SOC) are respectively adjusted to a durability battery temperature and a durability SOC, and five durability frequencies according to the embodiment.

FIG. 2 illustrates a typical example of the frequency change of the battery impedance ZB measured after adjusting the SOC and the temperature of a battery having the same lot as those of the evaluation batteries Ba to Be in the present embodiment to a durability SOC SOCd (=80%) and a durability battery temperature Td (=60° C.), and changing frequency in order in the frequency range of 1 MHz to 0.01 Hz. A graph of FIG. 2 is a Cole-Cole plot in which the horizontal axis represents a resistance Z' that is a real number part of the obtained battery impedance ZB and the vertical axis represents a reactance Z" that is an imaginary number part of the obtained battery impedance ZB (the upper side is represented as negative, that is, a capacitive reactance).

In the present embodiment, in the Cole-Cole plot of the battery impedance ZB of the evaluation battery at the durability SOC SOCd and the durability battery temperature Td illustrated in FIG. 2, the frequency f at which the graph first intersects the horizontal axis of Z"=0, that is, the frequency f (=50 kHz) at which the battery impedance ZB illustrated in FIG. 2 corresponds to reactance Z"=0Ω is set as the durability frequency $f_{da}$ of the alternating current voltage applied to the evaluation battery Ba in the durability test in step S4. In other words, in step S4, when the alternating current voltage of the durability frequency $f_{da}$ (=50 kHz) is applied to the evaluation battery Ba, in the evaluation battery Ba, it is possible to selectively generate the movement of an electron or an ion, which is faster than the positive electrode reaction occurring at the positive electrode or the negative electrode reaction occurring at the negative electrode from among the battery reactions occurring at the positive electrode and the negative electrode at the time of the charging/discharging of the battery, such that it is possible to selectively cause the deterioration of the evaluation battery Ba.

Further, in the Cole-Cole plot of the battery impedance ZB illustrated in FIG. 2, the frequency f (=1 kHz) approximately corresponding to the end point on the low frequency side of the changes to the semicircular arc shape that are generated by the negative electrode impedance portion Zn and the positive electrode impedance portion Zp, respectively, is set as the durability frequency $f_{de}$ of the alternating current voltage applied to the evaluation battery Bc in the durability test of step S4. In other words, in step S4, when the alternating current voltage of the durability frequency $f_{de}$ (=1 kHz) is applied to the evaluation battery Bc, in the evaluation battery Bc, it is possible to repeatedly and efficiently generate the positive electrode reaction between the positive electrode active material and the Li ion in the positive electrode from among the battery reactions occurring at the positive electrode and the negative electrode at the time of the charging/discharging of the battery, such that it is possible to efficiently cause the deterioration of the evaluation battery Bc.

In the battery of the present embodiment, in the Cole-Cole plot of the battery impedance ZB illustrated in FIG. 2, it is not possible to clearly separate a changed part of the semicircular arc shape generated by the negative electrode impedance portion Zn and a changed part of the semicircular arc shape generated by the positive electrode impedance portion Zp. However, when the battery temperature is set to a low temperature, such as −30° C., and the SOC of the battery is set to a low SOC, such as 20%, it is relatively easy to separate the two parts. Therefore, at a low temperature and a low SOC of the battery, the frequency f (=30 kHz) corresponding to a boundary between the changed part of the semicircular arc shape due to the negative electrode impedance portion Zn and the changed part of the semicircular arc shape due to the positive electrode impedance portion Zp that are separated is set as the durability frequency $f_{db}$ of the alternating current voltage applied to the evaluation battery Bb in the durability test in step S4. In other words, in step S4, when the alternating current voltage of the durability frequency $f_{db}$ (=30 kHz) is applied to the evaluation battery Bb, in the evaluation battery Bb, it is possible to efficiently generate the negative electrode reaction between the negative electrode active material and the Li ion in the negative electrode from among the battery reactions occurring at the positive electrode and the negative electrode at the time of the charging/discharging of the battery, such that it is possible to efficiently cause the deterioration of the evaluation battery Bb.

In addition, the frequency f corresponding to the Warburg impedance Wp in the equivalent circuit, that is, the frequency f (=0.1 Hz) in a frequency range in which diffusion movement of the Li ion in the positive electrode active material particle and the negative electrode active material particle is generated is set as the durability frequency $f_{dd}$ of the alternating current voltage applied to the evaluation battery Bd in the durability test in step S4. In other words, in step S4, when the alternating current voltage of the durability frequency $f_{dd}$ (=0.1 Hz) is applied to the evaluation battery Bd, in the evaluation battery Bd, it is possible to efficiently generate diffusion of a Li atom in the negative electrode active material particle and the positive electrode active material particle, in particular, diffusion movement of the Li atom on a surface portion of the negative electrode active material particle and a surface portion of the positive electrode active material particle from among the battery reactions occurring at the positive electrode and the negative electrode at the time of the charging/discharging of the battery, such that it is possible to efficiently cause the deterioration of the evaluation battery Bd.

In addition, the frequency f (=0.1 mHz) in which diffusion movement of the Li ion in the positive electrode active material particle and the negative electrode active material particle is sufficiently generated, which also corresponds to the Warburg impedance Wp in the equivalent circuit, is set as the durability frequency $f_{de}$ of the alternating current voltage applied to the evaluation battery Be in the durability test in step S4. In other words, in step S4, when the alternating current voltage of the durability frequency $f_{de}$ (=0.1 mHz) is applied to the evaluation battery Bd, in the evaluation battery Be, it is possible to efficiently generate diffusion of the Li atom in the negative electrode active material particle and the positive electrode active material particle, in particular, diffusion movement of the Li atom to a central portion of the negative electrode active material particle and to a central portion of the positive electrode active material particle from among the battery reactions occurring at the positive electrode and the negative electrode at the time of the charging/discharging of the battery, such that it is possible to efficiently cause the deterioration of the evaluation battery Be.

Similar to step S2, in step S6, the evaluation batteries Ba to Be to which the alternating current voltages of the durability frequencies $f_{da}$ to $f_{de}$ are respectively applied for 5 days in the durability test of step S4 are left under an environment of the evaluation battery temperature Te (Te=−30° C.) for 3 hours or longer, and then the SOCs of the evaluation batteries Ba to Be are respectively adjusted to the evaluation SOC SOCe (SOCe=20%) by the CCCV discharging. Thereafter, similar to step S3, in a post-durability impedance measurement step S7, impedances after executing durability for 5 days (hereinafter referred to as 5-day durability impedances) ZBa(5) to ZBe(5) of the evaluation batteries Ba to Be over a predetermined frequency range are measured, respectively.

As described above, in the present embodiment, in order to align the states of the evaluation batteries Ba to Be, the temperatures and the SOCs of the evaluation batteries Ba to Be are respectively adjusted to the same evaluation battery temperature Te (Te=−30° C.) and evaluation SOC SOCe (SOCe=20%) in the initial adjustment step S1 and the post-durability adjustment step S6, and thereafter pre-durability impedances ZBa(0) to ZBe(0) and the 5-day post-durability impedances ZBa(5) to ZBe(5) of the batteries Ba to Be are measured, respectively. As such, the battery impedance ZBa(0) and the like of the evaluation batteries Ba to Be which are adjusted to the evaluation battery temperature Te and the evaluation SOC SOCe different from the durability battery temperature Td (Td=60° C.) and the durability SOC SOCd (SOCd=80%) in the durability steps S4 and S5, are acquired, respectively. Thus, in the evaluation of the evaluation batteries Ba to Be, it is possible to evaluate the characteristics of the evaluation batteries Ba to Be before and after the durability at the evaluation battery temperature Te and the evaluation SOC SOCe appropriate for the evaluation while in the durability steps S4 and S5, it is possible to execute the durability test at the durability battery temperature Td and the durability SOC SOCd appropriate for the durability test. This point also applies to impedances after executing durability for 10 days (hereinafter referred to as 10-day post-durability impedances) ZBa(10) to ZBe(10) to be described below.

In the following re-durability determination step S8, it is determined whether to re-execute the durability test. When the determination is YES in step S8, that is, when the durability test is re-executed, the process returns to step S3, the evaluation batteries Ba to Be are left under an environment of the durability battery temperature Td (Td=60° C.) for 3 hours or longer, and then, the SOCs of the evaluation batteries Ba to Be are respectively adjusted to the durability SOC SOCd (SOCd=80%) by the CCCV charging. Thereafter, steps S4 to S7 are re-executed and the process returns to step S8. In the present embodiment, in step S8, the durability test is re-executed only once, such that in a second step S7, the 10-day post-durability impedances ZBa(10) to ZBe(10) of the evaluation batteries Ba to Be over the evaluation frequency range Wfe are measured, respectively. On the other hand, when the determination is NO in step S8, that is, when the durability test is not re-executed, the process proceeds to evaluation step S9.

Thus, in the present embodiment, as described above, in addition to obtaining the pre-leaving impedance ZBf(0), the 5-day post-leaving impedance ZBf(5), and the 10-day post-leaving impedance ZBf(10) of the reference battery Bf, the pre-durability impedances ZBa(0) to ZBe(0), the 5-day post-durability impedances ZBa(5) to ZBe(5), and the 10-day post-durability impedances ZBa(10) to ZBe(10) of the evaluation batteries Ba to Be are obtained, respectively.

Therefore, in the evaluation step S9, the durability of the respective evaluation batteries Ba to Be are evaluated from the change in the characteristics of the respective evaluation batteries Ba to Be before and after the durability test and the change in the characteristics of the reference battery Bf before and after the leaving test using the impedances ZBa(0) to ZBe(0) and the like.

In the present embodiment, in addition to the evaluation batteries Ba to Be, the pre-leaving impedance ZBf(0) and the post-leaving impedances ZBf(5) and ZBf(10) are obtained using the reference battery Bf before and after the leaving step of continuing to leave the reference battery Bf over the durability periods Dd1, Dd2. Then, in the evaluation step S9, the durability of the battery reactions of the evaluation batteries Ba to Be is evaluated using two or three of the pre-leaving impedance ZBf(0) and post-leaving impedances ZBf(5) and ZBf(10). For this reason, by comparing the case where the alternating current voltage of the durability frequency is applied (the evaluation battery) with the case where the alternating current voltage is not applied (the reference battery) over the same durability period, it is possible to more appropriately evaluate the durability of the battery reaction of the evaluation battery associated with the durability frequency.

Figure 4:
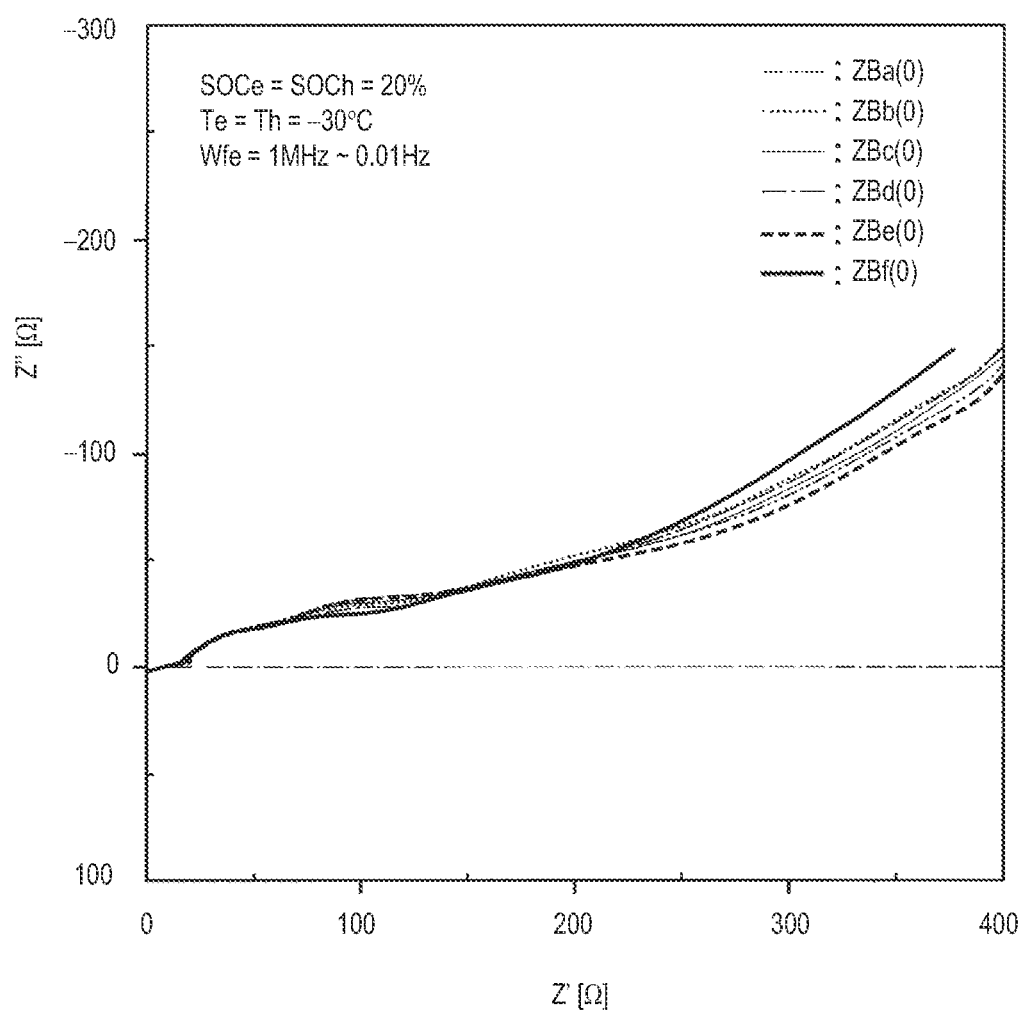
FIG. 4 is a Cole-Cole plot of pre-durability impedances of five evaluation batteries and a pre-leaving impedance of a reference battery according to the embodiment.

FIG. 4 is the Cole-Cole plot of the pre-durability impedances ZBa(0) to ZBe(0) of the five evaluation batteries Ba to Be and the pre-leaving impedance ZBf(0) of the reference battery Bf (six in total). As can be seen from the comparison of FIG. 4 with FIG. 2, the magnitudes of the battery impedances ZB of the respective batteries Ba to Bf illustrated in FIG. 2 corresponding to a case where the temperatures and the SOCs thereof are adjusted to the durability battery temperature Td (Td=60° C.) and the durability SOC SOCd (SOCd=80%) are approximately several Ω. On the other hand, it can be seen that the magnitudes of the pre-durability impedances ZBa(0) to ZBe(0) and the pre-leaving impedance ZBf(0) of the respective batteries Ba to Bf in a case where the temperatures and the SOCs thereof are adjusted to the evaluation battery temperature Te (Te=−30° C.) and the evaluation SOC SOCe (SOCe=20%) are approximately several hundreds of Ω, and are significantly larger than those in the case of FIG. 2 (approximately 100 times in the present embodiment). It is understood that since the battery temperature is low, the speed of the reaction and the like between the active material and the ion in the positive electrode and the negative electrode is significantly decreased.

Further, as illustrated in FIG. 4, the six graphs of the pre-durability impedances ZBa(0) to ZBe(0) and the pre-leaving impedance ZBf(0) of the respective batteries Ba to Bf have similar shapes and magnitudes to one another. In particular, in a range where the resistance Z' is equal to or less than approximately 200Ω, the graphs have similar shapes and magnitudes to one another. In other words, it can be seen that the pre-durability impedances ZBa(0) to ZBe(0) and the pre-leaving impedance ZBf(0) of the respective batteries Ba to Bf have similar characteristics to one another.

Figure 5:
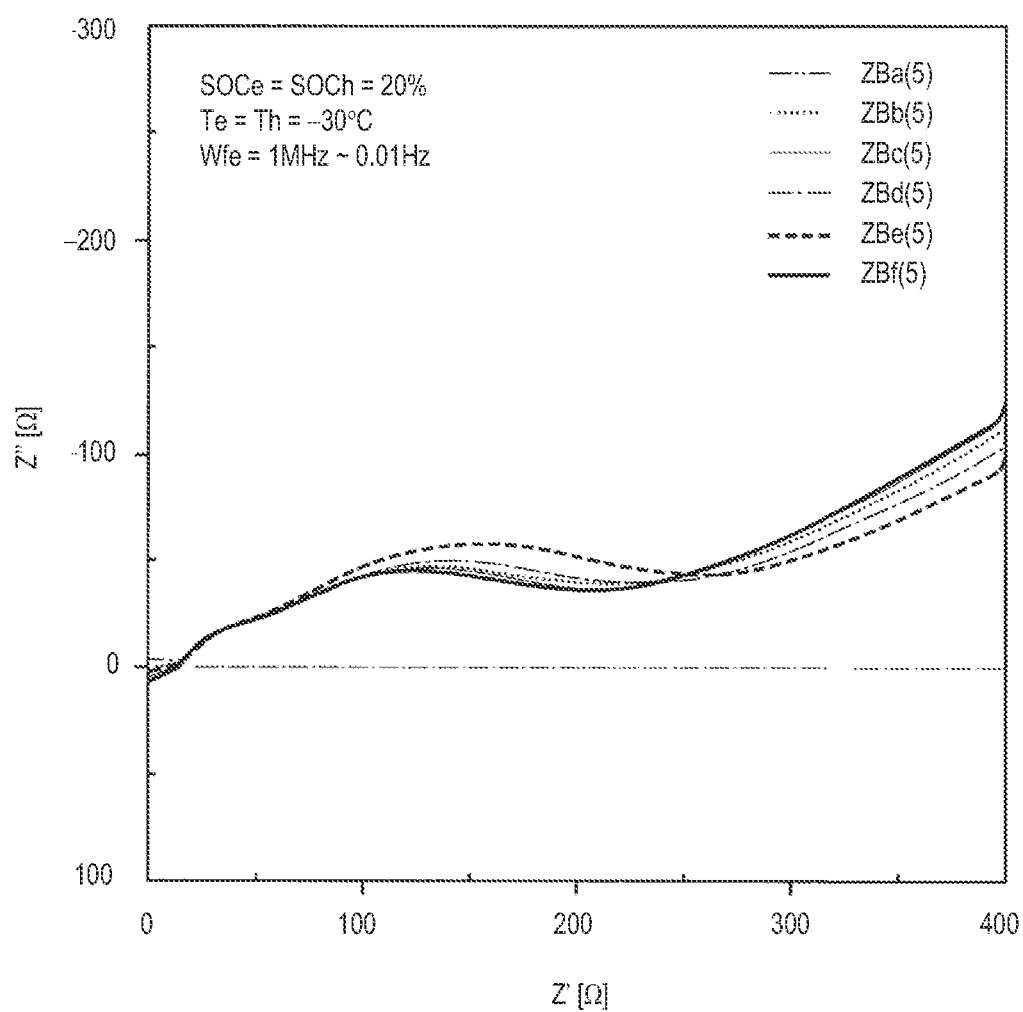
FIG. 5 is the Cole-Cole plot of impedances after executing durability to the five evaluation batteries for 5 days and an impedance after leaving the reference battery for 5 days according to the embodiment.

Next, FIG. 5 illustrates a Cole-Cole plot of the 5-day post-durability impedances ZBa(5) to ZBe(5) of the five evaluation batteries Ba to Be and the 5-day post-leaving impedance ZBf(5) of the reference battery Bf. In addition, FIG. 6 illustrates a Cole-Cole plot of the 10-day post-durability impedances ZBa(10) to ZBe(10) of the five evaluation batteries Ba to Be and the 10-day post-leaving impedance ZBf(10) of the reference battery Bf.

Figure 6:
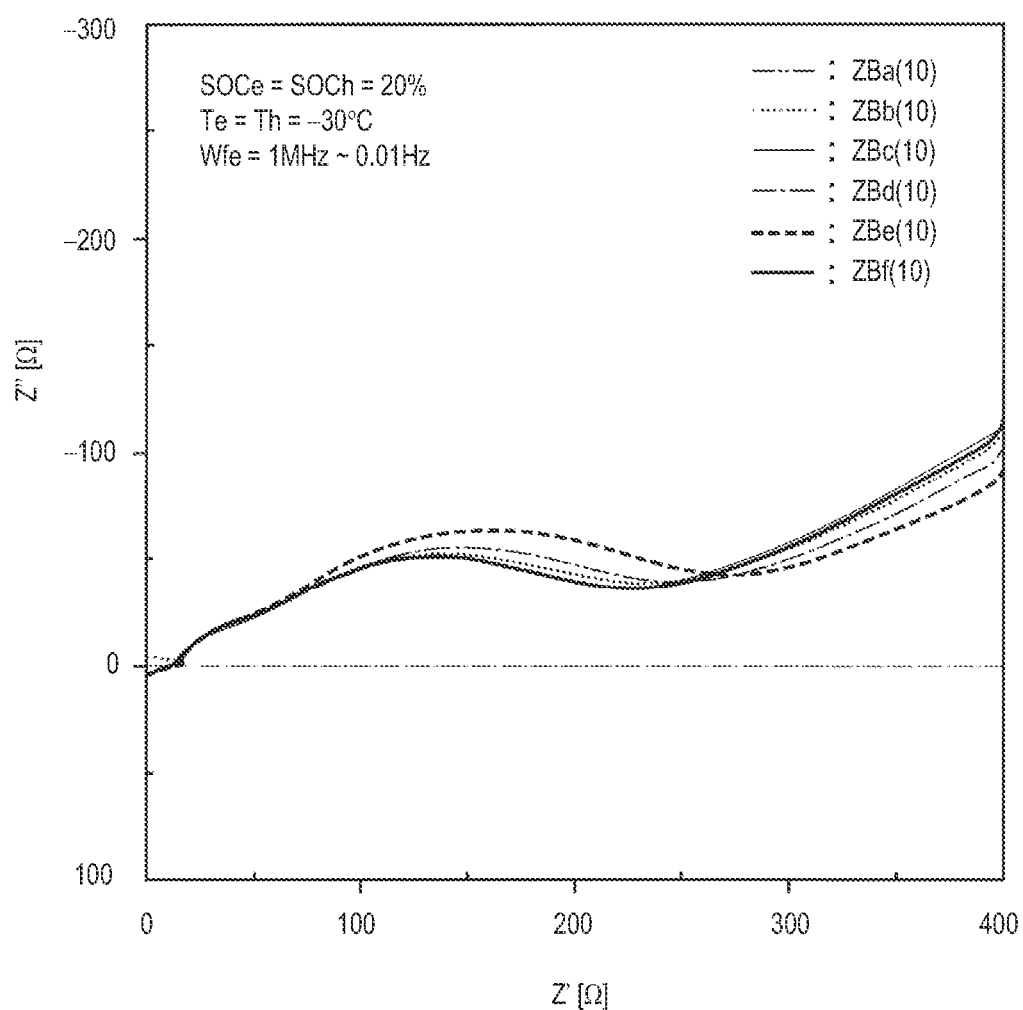
FIG. 6 is the Cole-Cole plot of impedances after executing durability to the five evaluation batteries for 10 days and an impedance after leaving the reference battery for 10 days according to the embodiment.

As can be seen from FIGS. 4 to 6, in the evaluation batteries Ba to Be of the present embodiment, it can be seen that the biggest difference in characteristics between the 5-day post-leaving impedance ZBf(5) of the reference battery Bf or the 10-day post-leaving impedance ZBf(10) represented by a thick line occurs in the 5-day post-durability impedance ZBe(5) and the 10-day post-durability impedance ZBe(10) of the evaluation battery Be represented by a thick dashed line. In other words, it can be seen that when an alternating current voltage of a durability frequency $f_{de}$=0.1 mHz is applied, the characteristics of the evaluation battery Be significantly change (deteriorate) as compared with when an alternating current voltage of a durability frequency $f_d$ ($f_{da}$ to $f_{dd}$) of another magnitude is applied.

As such, in the present embodiment, the alternating current voltages of different durability frequencies $f_d$ (five types of durability frequencies $f_{da}$ to $f_{de}$ in the present embodiment) are respectively applied to a plurality of evaluation batteries (five batteries Ba to Be in the present embodiment). For this reason, it is possible to efficiently and appropriately evaluate the durability of a specific battery reaction of the evaluation batteries Ba to Be of the present embodiment.

Next, from among the graphs illustrated in FIGS. 4 to 6, FIG. 7 illustrates a graph of a Cole-Cole plot of the pre-durability impedance ZBe(0), the 5-day post-durability impedance ZBe(5), and the 10-day post-durability impedance ZBe(10) of the evaluation battery Be to which the alternating current voltage of the durability frequency $f_{de}$=0.1 mHz is applied. Further, similarly, FIG. 8 illustrates a graph of a Cole-Cole plot of the pre-leaving impedance ZBf(0), the 5-day post-leaving impedance ZBf(5), and the 10-day post-leaving impedance ZBf(10) of the reference battery Bf.

Figure 7:
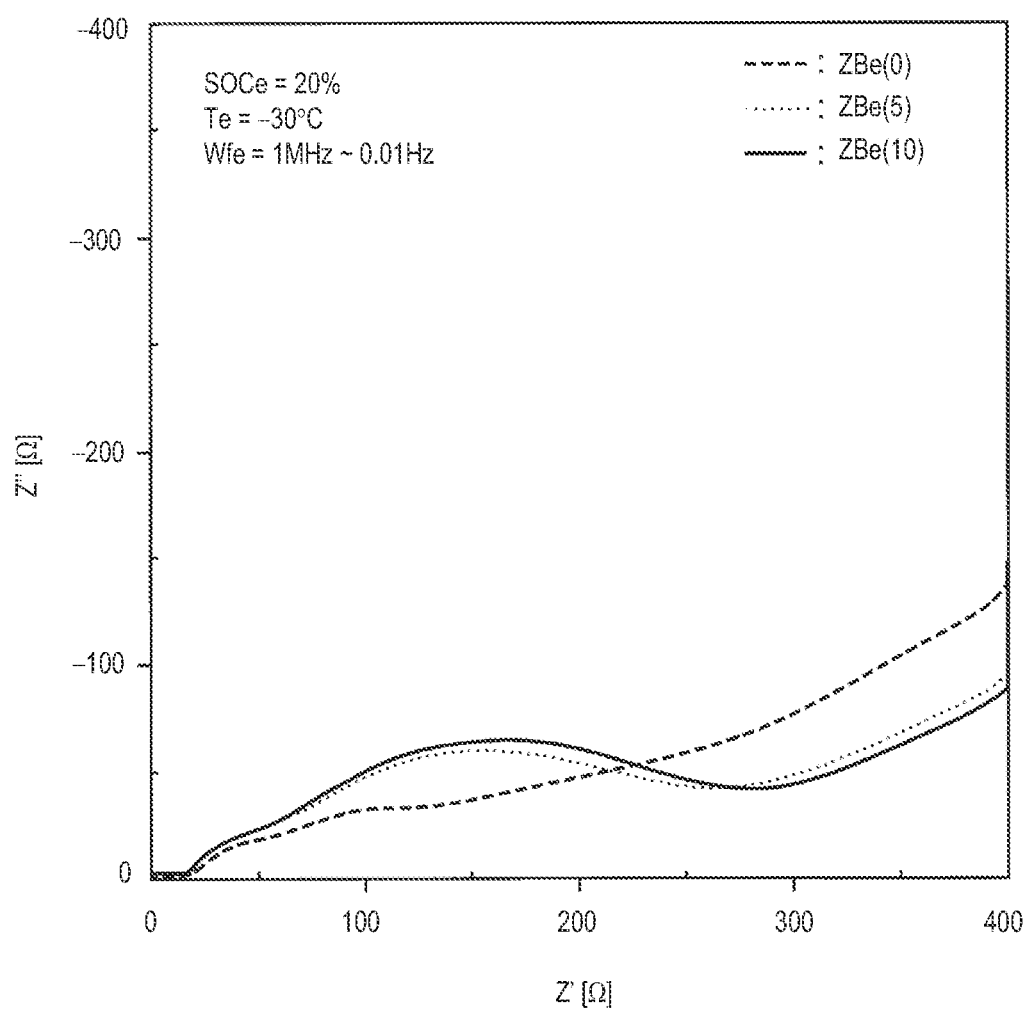
FIG. 7 is the Cole-Cole plot of the pre-durability impedance, the impedance after executing durability for 5 days, and the impedance after executing durability for 10 days to the evaluation battery to which an alternating current voltage of a durability frequency=0.1 mHz is applied according to the embodiment.

Then, in a pre-durability resistance acquisition step S9a from among step S9, assuming the equivalent circuit of the above-described FIG. 3, using curve fitting software ZView manufactured by Scribner Associates, the magnitudes of the direct current resistance Rs, the negative electrode reaction resistance Rn, and the positive electrode reaction resistance Rp are estimated and a pre-durability direct current resistance Rse(0) and a pre-durability negative electrode reaction resistance Rne(0), and a pre-durability positive electrode reaction resistance Rpe(0) are obtained from the graph of the pre-durability impedance ZBe(0) illustrated in FIG. 7. Further, similarly, in the post-durability resistance acquisition step S9b in addition to a 5-day post-durability direct current resistance Rse(5), a 5-day post-durability negative electrode reaction resistance Rne(5), and a 5-day post-durability positive electrode reaction resistance Rpe(5), a 10-day post-durability direct current resistance Rse(10), a 10-day post-durability negative electrode reaction resistance Rne(10), and a 10-day post-durability positive electrode reaction resistance Rpe(10) are obtained from the graphs of the 5-day post-durability impedance ZBe(5) and the 10-day post-durability impedance ZBe(10) illustrated in FIG. 7. By using the above, as to be described below, it is possible to evaluate the characteristics, such as the characteristic change before and after the durability test of the evaluation battery Be.

Figure 9:
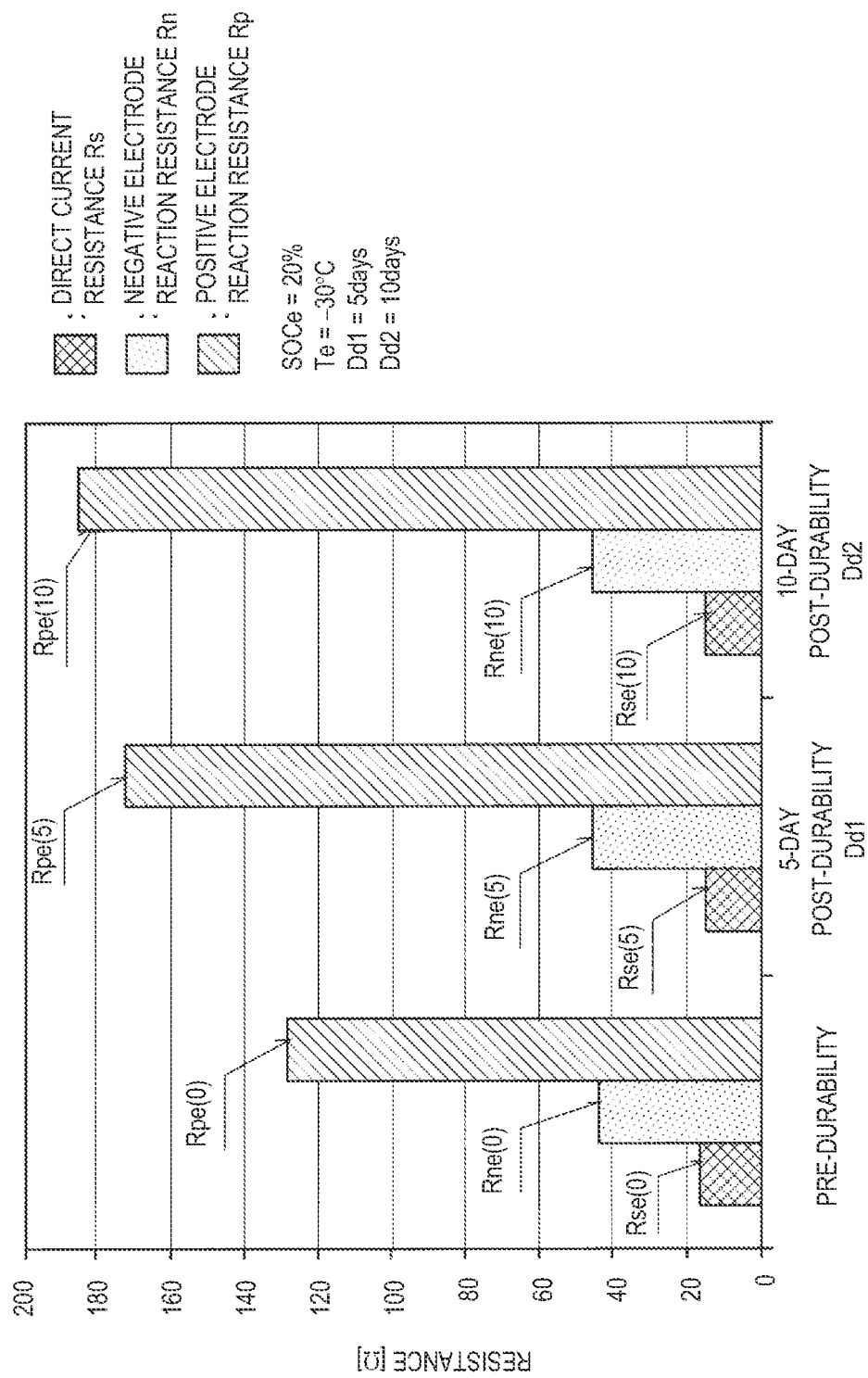
FIG. 9 is a graph illustrating a transition of a direct current resistance, a negative electrode reaction resistance, and a positive electrode reaction resistance obtained from the evaluation battery to which the alternating current voltage of the durability frequency=0.1 mHz is applied according to the present embodiment.

FIG. 9 illustrates a transition of the magnitudes of the direct current resistance Rs, the negative electrode reaction resistance Rn, and the positive electrode reaction resistance Rp by the durability test, that is, the pre-durability direct current resistance Rse(0), the 5-day post-durability direct current resistance Rse(5), and the 10-day post-durability direct current resistance Rse(10), the pre-durability negative electrode reaction resistance Rne(0), the 5-day post-durability negative electrode reaction resistance Rne(5), the 10-day post-durability negative electrode reaction resistance Rne (10), the pre-durability positive electrode reaction resistance Rpe(0), the 5-day post-durability positive electrode reaction resistance Rpe(5), and the 10-day post-durability positive electrode reaction resistance Rpe(10).

Figure 8:
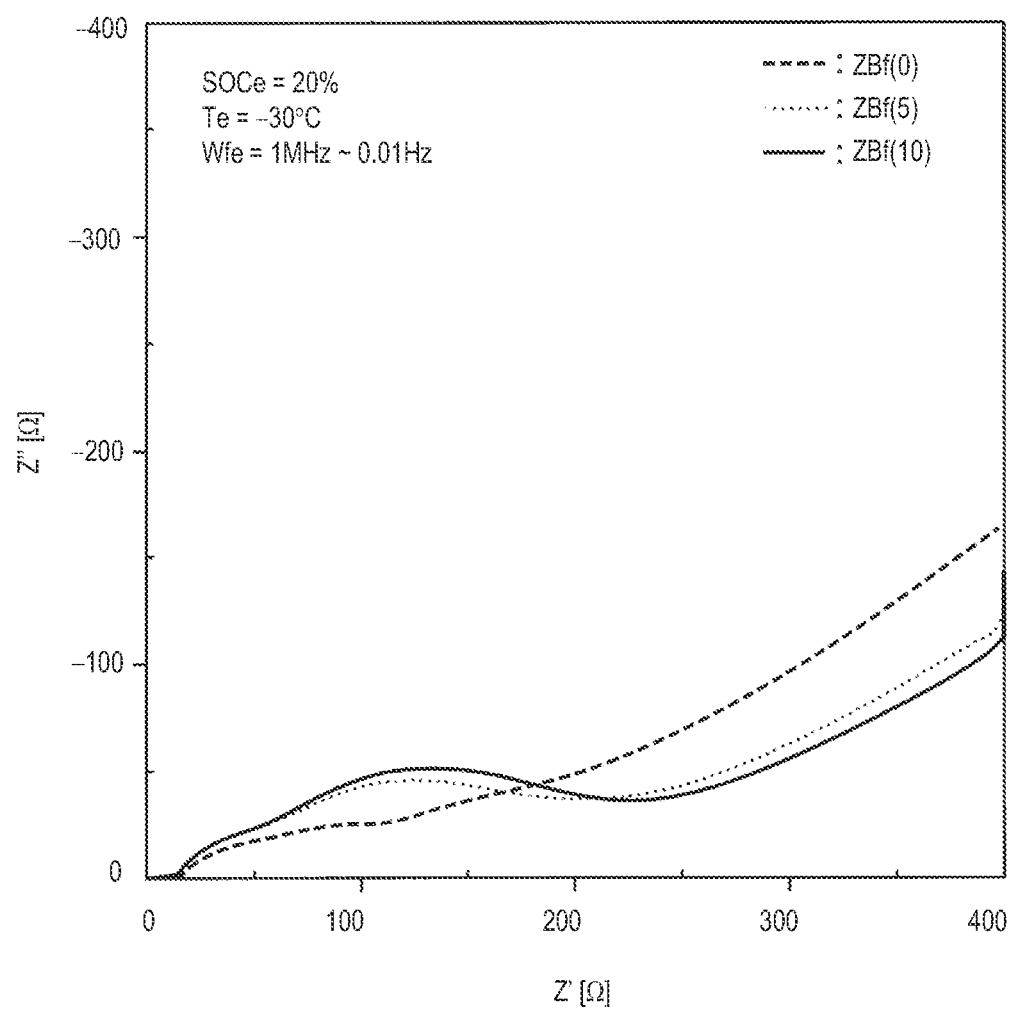
FIG. 8 is the Cole-Cole plot of the pre-leaving impedance, the impedance after leaving for 5 days, and the impedance after leaving for 10 days the reference battery according to the embodiment.

Similarly, in the pre-leaving resistance acquisition step S9c, the magnitudes of the direct current resistance Rs, the negative electrode reaction resistance Rn, and the positive electrode reaction resistance Rp are estimated and a pre-leaving direct current resistance Rsf(0), a pre-leaving negative electrode reaction resistance Rnf(0), and a pre-leaving positive electrode reaction resistance Rpf(0) are obtained from the graph of the pre-leaving impedance ZBf(0) illustrated in FIG. 8. Further, similarly, in the post-leaving resistance acquisition step S9d in addition to a 5-day post-leaving direct current resistance Rsf(5), a 5-day post-leaving negative electrode reaction resistance Rnf(5), and the 5-day post-leaving positive electrode reaction resistance Rpf(5), a 10-day direct post-leaving current resistance Rsf(10), a 10-day post-leaving negative electrode reaction resistance Rnf(10), and a 10-day post-leaving positive electrode reaction resistance Rpf(10) are obtained from the graphs of the 5-day post-leaving impedance ZBf(5) and the 10-day post-leaving impedance ZBf(10) illustrated in FIG. 8. By using these as well, as to be described below, it is possible to evaluate the characteristics, such as the characteristic change before and after the durability test of the evaluation battery Be based on the reference battery Bf.

Figure 10:
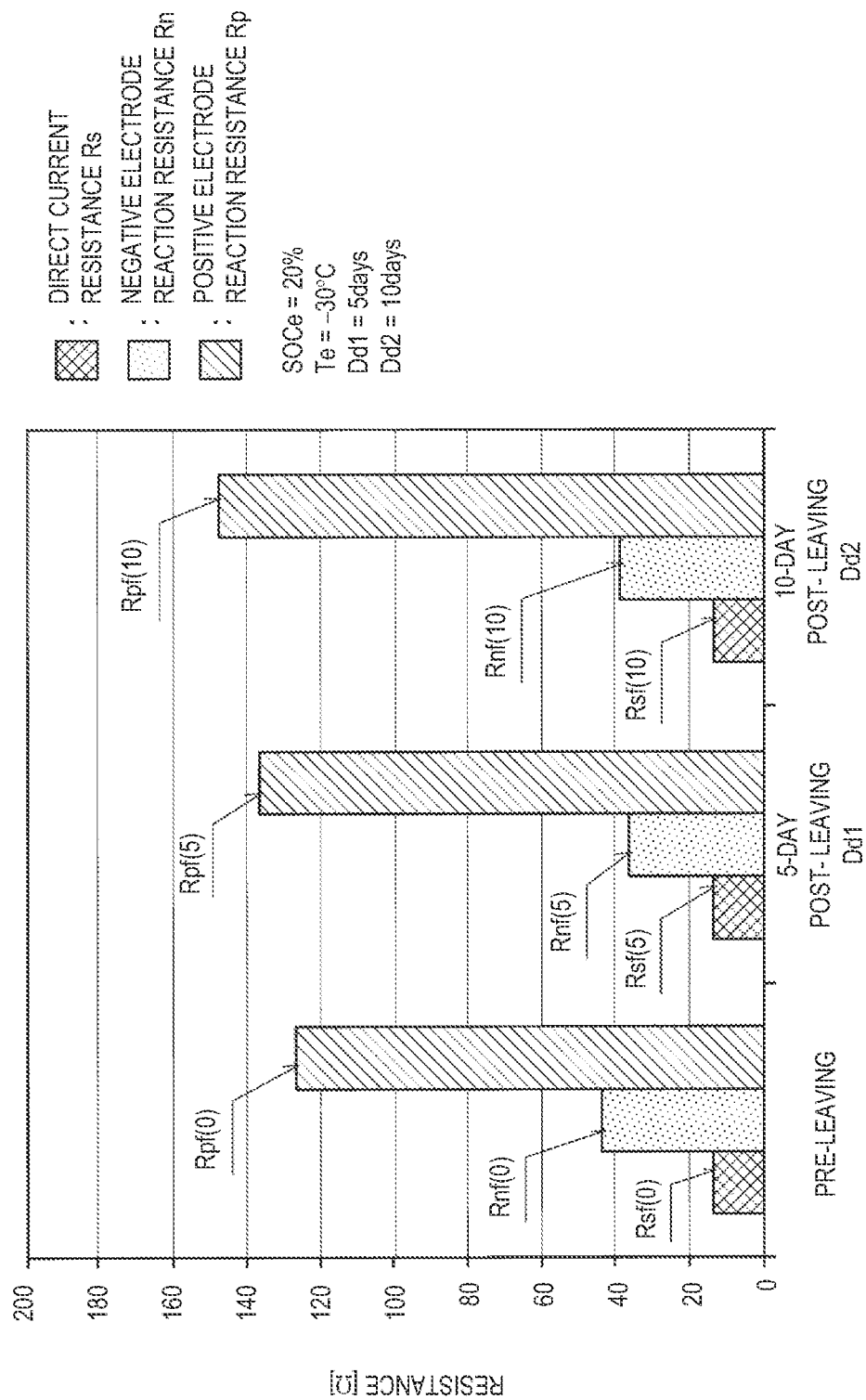
FIG. 10 is a graph illustrating a transition of the direct current resistance, the negative electrode reaction resistance, and the positive electrode reaction resistance obtained from the reference battery, which is left under an environment of a leaving battery temperature in a state where both terminals are open according to the embodiment.

FIG. 10 illustrates a transition of the magnitudes of the direct current resistance Rs, the negative electrode reaction resistance Rn, and the positive electrode reaction resistance Rp by the leaving test, that is, the pre-leaving direct current resistance Rsf(0), the 5-day post-leaving direct current resistance Rsf(5), and the 10-day post-leaving direct current resistance Rsf(10), the pre-leaving negative electrode reaction resistance Rnf(0), the 5-day post-leaving negative electrode reaction resistance Rnf(5), the 10-day post-leaving negative electrode reaction resistance Rnf(10), the pre-leaving positive electrode reaction resistance Rpf(0), the 5-day post-leaving positive electrode reaction resistance Rpf(5), and the 10-day post-leaving positive electrode reaction resistance Rpf(10).

First, the direct current resistance Rs will be examined. In the graph of the reference battery Bf of FIG. 10, the pre-leaving direct current resistance Rsf(0), the 5-day post-leaving direct current resistance Rsf(5), and the 10-day post-leaving direct current resistance Rsf(10) are hardly changed. In other words, it can be seen that the direct current resistance Rs of the battery (the reference battery Bf) of the present embodiment is not changed when leaving the battery at the durability battery temperature Td (=60° C.) and the durability SOC SOCd (=80%) over the 5-day durability period Dd1 and the 10-day durability period Dd2. It is understood that this is because the direct current resistance Rs in the battery of the present embodiment is a resistance component generated in a conductor and the like, and the direct current resistance Rs is not changed when leaving the battery at a high temperature and a high SOC (Td=60° C., SOCd=80%).

On the other hand, in the graph of the evaluation battery Be of FIG. 9 as well, the pre-durability direct current resistance Rse(0), the 5-day post-durability direct current resistance Rse(5), and the 10-day post-durability direct current resistance Rse(10) are hardly changed. It is understood that this is because the direct current resistance Rs of the battery (the reference battery Be) of the present embodiment is not changed even when the alternating current voltage of the durability frequency $f_{de}$=0.1 mHz, which changes the voltage significantly slowly, is applied, in addition to leaving the battery at the durability battery temperature Td (=60° C.) and the durability SOC SOCd (=80%) over the 5-day durability period Dd1 and the 10-day durability period Dd2.

Next, the negative electrode reaction resistance Rn will be examined. In the graph of the reference battery Bf of FIG. 10, the pre-leaving negative electrode reaction resistance Rnf(0), the 5-day post-leaving negative electrode reaction resistance Rnf(5), and the 10-day post-leaving negative electrode reaction resistance Rnf(10) are hardly changed, either. In other words, it can be seen that the negative electrode reaction resistance Rn of the battery of the present embodiment is not changed, either when leaving the battery at the durability battery temperature Td and the durability SOC SOCd over the durability periods Dd1 and Dd2. It is understood that this is because the negative electrode reaction resistance Rn in the battery of the present embodiment is a resistance component generated at the time of reaction between the negative electrode active material particle and the Li ion, and any alteration in which a change in the reaction with the Li ion is generated is not generated in the negative electrode active material particle when leaving the battery at a high temperature and a high SOC (Td=60° C., SOCd=80%).

On the other hand, in the graph of the evaluation battery Be of FIG. 9 as well, the pre-durability negative electrode reaction resistance Rne(0), the 5-day post-durability negative electrode reaction resistance Rne(5), and the 10-day post-durability negative electrode reaction resistance Rne (10) are hardly changed. It is understood that this is because any alteration in which a change in the reaction with the Li ion is generated is not generated in the negative electrode reaction resistance Rn of the battery (the evaluation battery Be) of the present embodiment even when the alternating current voltage of the durability frequency $f_{de}$=0.1 mHz, which changes the voltage significantly slowly, is applied, in addition to leaving the battery at the durability battery temperature Td and the durability SOC SOCd over the durability periods Dd1 and Dd2.

In addition, the positive electrode reaction resistance Rp will be examined. Unlike the direct current resistance Rs and the negative electrode reaction resistance Rn, it can be seen that in the graph of the reference battery Bf of FIG. 10, the pre-leaving positive electrode reaction resistance Rpf(0), the 5-day post-leaving positive electrode reaction resistance Rpf(5), and the 10-day post-leaving positive electrode reaction resistance Rpf(10) are gradually increased along with the lapse of the durability periods Dd1 and Dd2, and in the 10-day durability period Dd2, the positive electrode reaction resistance Rp is increased by approximately 16%. It can be understood that the positive electrode reaction resistance Rp in the battery of the present embodiment is a resistance component generated at the time of the reaction between the positive electrode active material particle and the Li ion, but an alteration is gradually generated in the positive electrode active material particle, and a change (deterioration) to a direction in which it is difficult for the reaction between the positive electrode active material particle and the Li ion to occur is generated when leaving the battery at a high temperature and a high SOC (Td=60° C., SOCd=80%).

On the other hand, as can be seen by comparing FIG. 10 with FIG. 9, it can be seen that in the graph of the evaluation battery Be of FIG. 9, the pre-durability positive electrode reaction resistance Rpe(0), the 5-day post-durability positive electrode reaction resistance Rpe(5), and the 10-day post-durability positive electrode reaction resistance Rpe(10) are increased along with the lapse of the durability periods Dd1 and Dd2, and the positive electrode reaction resistance Rp is increased by approximately 34% in the durability period Dd1 (5 days) and by approximately 45% in the durability period Dd2 (10 days). In other words, it is considered that the positive electrode reaction resistance Rp is increased not only by approximately 16% by being left for 10 days, but also by approximately 29% by the application of the alternating current voltage of the durability frequency $f_{de}$=0.1 mHz for 10 days. In other words, it is understood that in the battery of the present embodiment, the alteration is accelerated in the positive electrode active material particle, and the change (deterioration) to the direction in which it is difficult for the reaction between the positive electrode active material particle and the Li ion to occur is generated further by leaving the battery at the durability battery temperature Td and the durability SOC SOCd over the durability periods Dd1 and Dd2 and the application of the alternating current voltage of the durability frequency $f_{de}$=0.1 mHz, which changes the voltage significantly slowly such that the positive electrode reaction resistance Rp is significantly increased.

As such, in the present embodiment, in addition to the reference battery Bf, alternating current voltages of different durability frequencies $f_{da}$ to $f_{de}$ are applied to the five evaluation batteries Ba to Be, respectively. As such, by evaluating the durability of the battery reaction associated with the durability frequencies $f_{da}$ to $f_{de}$ of the applied alternating current voltage, it is possible to efficiently and appropriately evaluate the durability of a specific battery reaction of the batteries Ba to Be.

The present disclosure has been described as above according to the embodiments, but the embodiments disclosed herein are exemplary in all respects and are not restrictive. The technical scope defined by the claims includes all changes within the meaning and scope equivalent to the claims.

For example, in the present embodiment, in the evaluation of the evaluation batteries Ba to Be in the evaluation step S9, an example is illustrated in which the pre-leaving impedance ZBf(0) and the post-leaving impedances ZBf(5) and ZBf(10) of the reference battery Bf are obtained and two or three of the pre-leaving impedance ZBf(0) and the post-leaving impedances ZBf(5) and ZBf(10) are used.

However, in the evaluation of the evaluation batteries Ba to Be, it is possible to execute the evaluation using the post-durability impedances ZBa(5) to ZBe(5) and ZBa(10) to ZBe(10) based on the pre-durability impedances ZBa(0) to ZBe(0) without using the reference battery Bf, and its pre-leaving impedance ZBf(0) and post-leaving impedances ZBf(5) and ZBf(10). Further, it is also possible to evaluate the evaluation batteries Ba to Be using the post-leaving impedance ZBf(5) or ZBf(10) without using the pre-leaving impedance ZBf(0) of the reference battery Bf.

Further, only for the evaluation battery Be from among the evaluation batteries Ba to Be (see FIGS. 4 to 6), the pre-durability positive electrode reaction resistance Rpe(0), the post-durability positive electrode reaction resistances Rpe(5) and Rpe(10), or the like are obtained from the Cole-Cole plot and the deterioration of the characteristics of the battery Be and the like is examined. However, similarly, it is also possible to obtain the pre-durability positive electrode reaction resistance, the post-durability positive electrode reaction resistance, or the like for the other evaluation batteries Ba to Bd and examine the deterioration of the characteristics of the batteries Ba to Bd.

What is claimed is:

1. A durability evaluation method of a secondary battery, the durability evaluation method comprising:
   a durability step of continuing to apply an alternating current voltage of a durability frequency to a first secondary battery for evaluation over a durability test period, a temperature and a state of charge (SOC) of the first secondary battery being adjusted to a first temperature and a first SOC, respectively;
   a determination step of determining whether the durability test period has elapsed; and
   based on the determination that the durability test period has elapsed, an evaluation step of evaluating durability of an associated battery reaction associated with the durability frequency from among battery reactions of the first secondary battery,
   wherein the durability evaluation method further comprises:
      an initial adjustment step of adjusting the temperature and the SOC of the first secondary battery to a second temperature and a second SOC, the second temperature and the second SOC being determined in advance;
      a pre-durability impedance measurement step of measuring a first impedance of the adjusted first secondary battery over an evaluation frequency range;
      a pre-durability adjustment step of adjusting the temperature and the SOC of the first secondary battery to the first temperature and the first SOC, the initial adjustment step, the pre-durability impedance measurement step, and the pre-durability adjustment step being executed before the durability step;
      a post-durability adjustment step of adjusting the temperature and the SOC of the first secondary battery after the durability step to the second temperature and the second SOC; and
      a post-durability impedance measurement step of measuring a second impedance of the adjusted first secondary battery over the evaluation frequency range, the post-durability adjustment step and the post-durability impedance measurement step being executed after the durability step and before the evaluation step,
   wherein in the evaluation step, the durability of the battery reaction of the first secondary battery is evaluated using the first impedance and the second impedance obtained for the first secondary battery,
   wherein the durability test period includes a first durability test period and a second durability test period, the first durability test period being a period in a case where a durability test is conducted once and the second durability test period being a period in a case where the durability test is conducted twice.

2. The durability evaluation method according to claim 1, wherein the durability test period is greater than or equal to 5 days.

3. The durability evaluation method according to claim 1, further comprising:
   a reference initial adjustment step of adjusting a temperature and a SOC of a second secondary battery for reference to a third temperature and a third SOC, the second secondary battery being different from the first secondary battery;

a pre-leaving impedance measurement step of measuring a third impedance of the adjusted second secondary battery over the evaluation frequency range;

a pre-leaving adjustment step of adjusting the temperature and the SOC of the second secondary battery to the first temperature and the first SOC;

a leaving step of continuing to leave, over the durability test period, the second secondary battery of which the temperature and the SOC are adjusted to the first temperature and the first SOC in a state where positive and negative electrodes are open;

a post-leaving adjustment step of adjusting the temperature and the SOC of the second secondary battery after the leaving step to the third temperature and the third SOC; and a post-leaving impedance measurement step of measuring a fourth impedance of the adjusted second secondary battery over the evaluation frequency range, wherein, in the evaluation step, the durability of the battery reaction of the first secondary battery is evaluated using at least the fourth impedance from among the third impedance and the fourth impedance of the second secondary battery.

4. The durability evaluation method according to claim 3, wherein the evaluation step comprises at least a post-leaving resistance acquisition step from among:

a pre-leaving resistance acquisition step of acquiring a third direct current resistance, a third positive electrode reaction resistance, and a third negative electrode reaction resistance of the second secondary battery using the third impedance measured over the evaluation frequency range; and the post-leaving resistance acquisition step of acquiring a fourth direct current resistance, a fourth positive electrode reaction resistance, and a fourth negative electrode reaction resistance of the second secondary battery using the fourth impedance measured over the evaluation frequency range.

* * * * *